United States Patent
Rock et al.

(10) Patent No.: US 11,519,946 B1
(45) Date of Patent: Dec. 6, 2022

(54) PACKAGED CURRENT SENSOR INTEGRATED CIRCUIT

(71) Applicant: Allegro MicroSystems, LLC, Manchester, NH (US)

(72) Inventors: Simon E. Rock, Heidelberg (DE); Alexander Latham, Harvard, MA (US); Robert A. Briano, Auburn, NH (US); Shixi Louis Liu, Hooksett, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/409,011

(22) Filed: Aug. 23, 2021

(51) Int. Cl.
*G01R 19/165* (2006.01)
*G01R 33/07* (2006.01)

(52) U.S. Cl.
CPC ....... *G01R 19/1659* (2013.01); *G01R 33/072* (2013.01)

(58) Field of Classification Search
CPC .................... G01R 33/07–098; G01R 19/1659
See application file for complete search history.

(56) References Cited

U.S. PATENT DOCUMENTS

| | | | |
|---|---|---|---|
| 6,356,068 B1 | 3/2002 | Steiner et al. | |
| 6,781,359 B2 | 8/2004 | Stauth et al. | |
| 7,265,531 B2 | 9/2007 | Stauth et al. | |
| 7,598,601 B2 | 10/2009 | Taylor et al. | |
| 8,080,994 B2 * | 12/2011 | Taylor | G01R 33/07 |
| | | | 324/252 |
| 8,629,539 B2 | 1/2014 | Milano et al. | |
| 8,907,437 B2 | 12/2014 | Milano et al. | |
| 9,190,606 B2 | 11/2015 | Liu et al. | |
| 9,299,915 B2 | 3/2016 | Milano et al. | |
| 9,620,705 B2 | 4/2017 | Milano et al. | |
| 9,865,807 B2 | 1/2018 | Liu et al. | |
| 10,333,055 B2 | 6/2019 | Milano et al. | |
| 10,345,343 B2 * | 7/2019 | Milano | G01R 19/0092 |
| 10,509,058 B2 | 12/2019 | Cadugan et al. | |
| 10,578,684 B2 | 3/2020 | Cadugan et al. | |
| 10,718,794 B2 | 7/2020 | El Bacha et al. | |
| 10,753,963 B2 | 8/2020 | Milano et al. | |
| 11,085,952 B2 | 8/2021 | Cadugan et al. | |
| 2005/0030018 A1 * | 2/2005 | Shibahara | G01R 15/20 |
| | | | 324/251 |

(Continued)

OTHER PUBLICATIONS

U.S. Appl. No. 17/654,254, filed Mar. 10, 2022, Boden, et al.

*Primary Examiner* — Patrick Assouad
*Assistant Examiner* — Demetrius R Pretlow
(74) *Attorney, Agent, or Firm* — Daly, Crowley, Mofford & Durkee, LLP

(57) ABSTRACT

A packaged current sensor integrated circuit includes a primary conductor having an input portion and an output portion configured to carry a current to be measured by a magnetic sensing element supported by a semiconductor die adjacent to the primary conductor. Each of the input portion and output portion of the primary conductor is exposed from orthogonal sides of the package body. A fault signal may be provided to indicate an overcurrent condition in the integrated current sensor package. The primary current path may be made of a thick lead frame material to reduce the primary current path resistance.

21 Claims, 3 Drawing Sheets

(56) References Cited

U.S. PATENT DOCUMENTS

| | | | |
|---|---|---|---|
| 2007/0279053 A1* | 12/2007 | Taylor | G01R 15/207 324/252 |
| 2009/0295368 A1* | 12/2009 | Doogue | G01R 15/207 324/117 R |
| 2010/0156394 A1* | 6/2010 | Ausserlechner | G01R 15/202 324/144 |
| 2011/0234215 A1* | 9/2011 | Ausserlechner | G01R 33/072 324/244 |
| 2013/0015843 A1* | 1/2013 | Doogue | G01R 15/148 324/202 |
| 2013/0020660 A1* | 1/2013 | Milano | G01R 15/207 257/E27.005 |
| 2013/0138372 A1* | 5/2013 | Ausserlechner | G01R 35/005 702/65 |
| 2014/0253103 A1* | 9/2014 | Racz | G01R 15/202 324/149 |
| 2016/0187388 A1* | 6/2016 | Suzuki | G01R 15/207 324/244 |
| 2016/0223594 A1* | 8/2016 | Suzuki | G01R 15/20 |
| 2016/0282388 A1* | 9/2016 | Milano | H01L 43/065 |
| 2016/0313375 A1* | 10/2016 | Etschmaier | G01R 19/0092 |
| 2018/0306843 A1* | 10/2018 | Bussing | G01R 15/207 |
| 2019/0369144 A1* | 12/2019 | Mauder | H01L 25/18 |
| 2020/0064382 A1* | 2/2020 | Takata | G01R 19/15 |
| 2020/0191835 A1* | 6/2020 | Bilbao De Mendizabal | G01R 19/32 |
| 2021/0082789 A1 | 3/2021 | Briano et al. | |

* cited by examiner

Top view

PACKAGED CURRENT SENSOR INTEGRATED CIRCUIT

BACKGROUND

Some conventional current sensors are positioned near a current-carrying conductor to sense a magnetic field generated by a current through the conductor. The current sensor generates an output signal having a magnitude proportional to the magnetic field induced by the current through the conductor.

SUMMARY

A current sensor integrated circuit package has a primary conductor with an input portion and an output portion and where the primary conductor is configured to carry a current from the input portion of the primary conductor to the output portion of the primary conductor. A semiconductor die with an integrated circuit and at least one magnetic field sensing element is placed near the primary current conductor. The package has at least one secondary lead, and in an embodiment at least three secondary leads, to connect the semiconductor die to external circuits and systems and provide an input or output of the package. A package body encloses the semiconductor die and at least a portion of the primary conductor, wherein the input portion of the primary conductor is exposed from a first side of the package body and a second side of the package body that is substantially orthogonal with respect to the first side of the package body, and wherein the output portion of the primary conductor is accessible from the second side of the package body and a third side of the package body that is substantially orthogonal with respect to the second side of the package body and opposite with respect to the first side of the package body.

A packaged current sensor integrated circuit may have a primary conductor with a partial path that forms a straight line across the package body from the first side to the third side of the package.

The packaged current sensor integrated circuit may have a portion of the primary conductor exposed portion on the bottom of the package body. The secondary lead or secondary leads may also be exposed on the bottom of the package. An embodiment may have a narrowed current path portion of the primary conductor exposed on the bottom of the package.

In an embodiment the exposed pad portion of the primary conductor is substantially orthogonal to the first side of the package body, the second side of the package body, and the third side of the package body.

A secondary lead may be used to provide an output connection, a voltage input connection, and a ground connection.

The packaged current sensor integrated circuit may have a magnetic field sensing element connected to a front-end amplifier. The magnetic field sensing element may be a Hall effect sensor, or a magnetoresistance sensor, such as an AMR, GMR, TMR, or MTJ sensor.

In an embodiment a drive circuit may be connected to the magnetic field sensing element or elements.

Other circuits may be included in the integrated circuit such as a front end amplifier connected to an amplifier to provide an output indicative of the current level in the primary conductor.

A fault output circuit may also be included in the integrated circuit to provide an output when a fault is detected. A threshold circuit having an input configured to receive an input fault signal and an output and a comparator having a first input coupled to the output of the threshold circuit, a second input coupled to an output of the front end amplifier, and an output at which a fault signal is provided, wherein the fault signal is indicative of whether the current exceeds a level of the input fault signal.

The die may be attached to the lead frame, in an embodiment to the primary current conductor, a wafer backside coating material on the back of the semiconductor die. In an embodiment two layers of wafer backside coating are used. Another embodiment may attach the die to the lead frame using die attach epoxy or tape. In an embodiment multiple layers of wafer backside coating, epoxy, or tape are used.

An embodiment of the package integrated current sensor may have a minimum distance between the exposed portion of the primary conductor and the exposed portion of a nearest at least one secondary lead is at least 1.0 mm.

The packaged current sensor integrated circuit may have a lead frame thickness of the primary conductor and a thickness of the at least one secondary lead are between approximately 0.2 mm and 0.5 mm. In another embodiment the lead frame thickness of the primary conductor and a thickness of the at least one secondary lead are between approximately 0.35 mm and 0.40 mm.

BRIEF DESCRIPTION OF DRAWINGS

The foregoing features of this disclosure, as well as the disclosure itself, may be more fully understood from the following description of the drawings in which.

DETAILED DESCRIPTION

Figure 1:
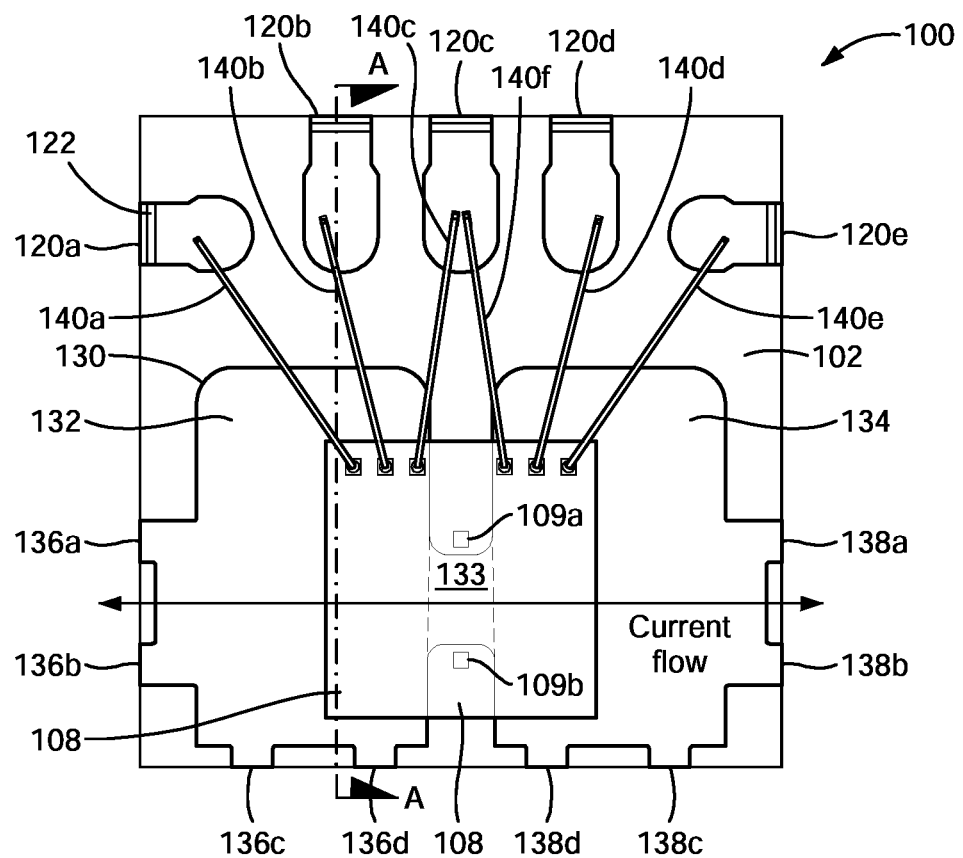
FIG. 1 provides a top view of a packaged current sensor integrated circuit.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half-bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the term "processor" or "controller" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals. In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital. A processor can contain internal processors or internal modules that perform portions of the function, operation, or sequence of operations of the processor. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but will be readily understood by one of ordinary skill in the art.

In particular, it should be understood that a so-called comparator can comprise an analog comparator having a two state output signal indicative of an input signal being above or below a threshold level (or indicative of one input signal being above or below another input signal). However, the comparator can also comprise a digital circuit having an output signal with at least two states indicative of an input signal being above or below a threshold level (or indicative of one input signal being above or below another input signal), respectively, or a digital value above or below a digital threshold value (or another digital value), respectively.

FIG. 1 shows a top view of a packaged current sensor integrated circuit 100. The package body 102 may be a mold compound and is shown as an outline for clarity.

A primary conductor 130 has input and output portions that can include die attach portions 132, 134, respectively, which support a semiconductor die 108. Primary conductor 130 has input and output leads 136a, 136b on a first side of the package and 136c, 136d on a second side of the package, and 138a, 138b on a third side of the package, 138c, 138d on said second side of the package. Input leads 136a, 136b, 136c, 136d are connected to die attach pad 132 and output leads 138a, 138b, 138c, 138d are connected to die attach pad 134.

The current sensor integrated circuit 100 also has secondary leads 120a, 120b, 120c, 120d, 120e. Wire bonds 140a, 140b, 140c, 140d, 140e, 140f connect the die 108 to the secondary, or signal leads, 120a, 120b, 120c, 120d, 120e. Secondary lead 120c is connected to die 108 using two wire bonds 140c, 140f. This may be advantageous when a potential for higher current may exist, such as for a power or ground connection to die 108.

A current path portion 133 of the primary conductor can interconnect die attach pads 132, 134 and can be a narrowed portion, as shown. The primary conductor 130 has a partial current path that forms a straight line across the package body from a first side of the package with leads 136a, 136b to a third side of the package with leads 138a, 138b. Die 108 supports at least one magnetic field sensing element, and in FIG. 1 two magnetic field sensing elements 109a, 109b. The die 108 can also support circuitry to amplify and process the signals from the magnetic field sensing elements and provide an output of the current sensor integrated circuit 100. As current flows through the current conductor portion 133, a magnetic field is generated and may be sensed by magnetic field sensing elements 109a, 109b. In FIG. 1, magnetic field sensing elements 109a, 109b are positioned off of or to the side of the current conductor portion 133 so that the magnetic field generated by the current flowing in the current conductor portion 133 has a direction component that is perpendicular to the die such that a planar Hall effect sensor may be used for magnetic field sensing elements 109a, 109b. In other embodiments, the magnetic field sensing elements, or element may be positioned over the primary current conductor portion to sense a magnetic field with a component parallel to the surface of die 108. In a case where the magnetic field component to be sensed is parallel to the surface of the die, a magnetoresistance element such as a vertical Hall element, a GMR, TMR, or AMR element may be used.

Figure 1A:
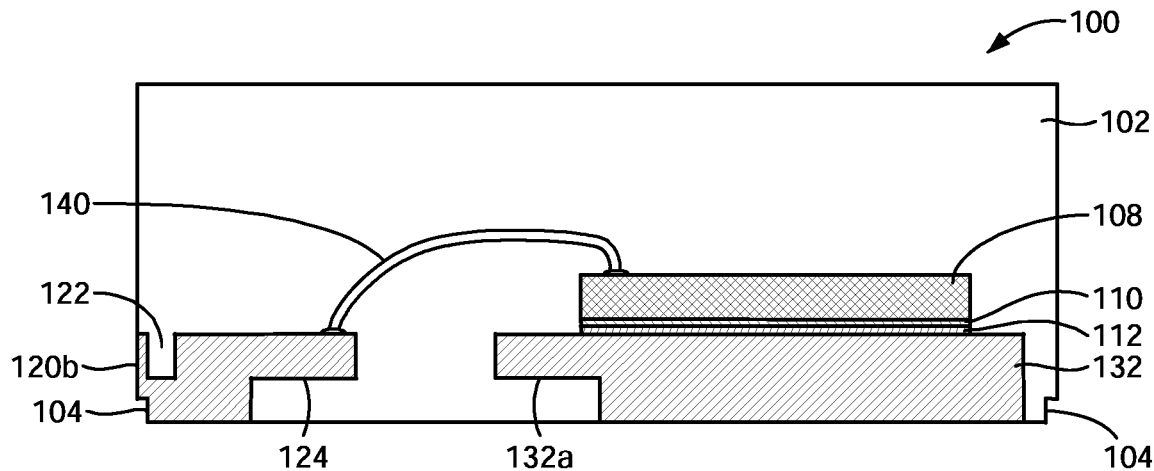
FIG. 1A shows a cross-sectional side view of the packaged current sensor integrated circuit package of FIG. 1.

Referring also to FIG. 1A, in which like elements are labeled with like reference numbers, a cross-sectional side view of the packaged current sensor integrated circuit 100 taken along the line A-A of FIG. 1 is shown. The package body 102 may have a recessed portion 104 around the bottom of the package. Die 108 is supported by the primary conductor die attach portion 132 which has a thinned portion 132a. Die 108 may be attached to the die attach portion 132 by a non-conductive coating, such as a wafer backside coating (WBC), shown as two layers 110, 112. In manufacturing, if two layers of wafer backside coating 110, 112 are used, the first wafer backside coating layer 110 may be fully cured (or partially cured if only one layer of a wafer backside coating is used) before a second layer of wafer backside coating 112 is partially cured (also known as B stage cured) is used to eventually attach die 108 to die attach portion 132 of the primary conductor 130 of FIG. 1.

In another embodiment the die 108 may be attached to the die attach portion 132 by other materials, including but not limited to by a non-conductive die attach epoxy, or a tape. Multiple layers of wafer backside coating, tape, and non-conductive epoxy may be used for electrical isolation. A combination of wafer backside coating, tape, or non-conductive epoxy may be used to achieve electrical isolation and attachment to the die attach portion 132.

Die 108 can be electrically connected to secondary lead 120b with a wire bond 140. Secondary lead 120b can have a recessed portion 122 and/or a thinned portion 124 which provide locking features with the mold compound 102. The thinned portion 124 may be the result of a half etch lead frame process. An example of a half etch process is when the lead frame is etched from two sides and on one etch side is masked, or patterned so that a partial thickness (or roughly half) of the lead frame remains at a portion of a lead or the lead frame. The package body 102 and secondary lead 120b may have cutouts or recessed portions 104, which in an embodiment may be around all of the bottom edges of the packaged current sensor integrated circuit 100.

Figure 1B:
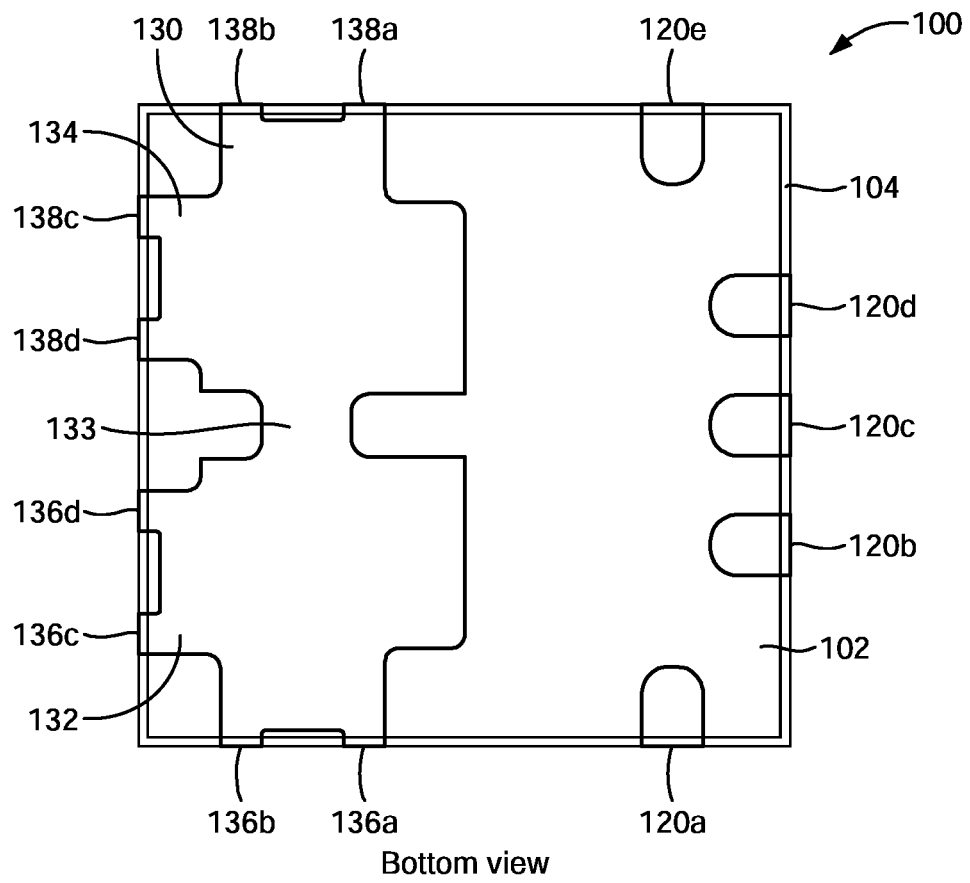
FIG. 1B shows a bottom view of the packaged current sensor integrated circuit of FIG. 1.

Referring also to FIG. 1B, in which like elements are labeled with like reference numbers, a bottom view of the packaged current sensor integrated circuit 100 is shown. Secondary leads 120a, 120b, 120c, 120d, 120e have an exposed portion on the bottom of the package 100. Primary current conductor 130 is shown with at least a portion of die attach portions 132, 134, current conductor portion 133, and leads 136a, 136b, 136c, 136d, 138a, 138b, 138c, 138d exposed on the bottom of package 100. In use, exposed portions of the die attach pads 132, 134 may be connected to a circuit board or other substrate and, due to the larger area of connection possible between the board and the primary conductor 130, the resistance of the connection may be lower, which results in lower power loss due to the connection resistance of the current sensor package 100 to a circuit board. In another embodiment, a solder connection may also be provided with the current conductor portion 133. If the solder connection or a current path is under the area 133, the current sensor IC accuracy may be improved if the gain of the current sensor integrated circuit is programmed with the current path of the current conductor portion 133 in parallel with a solder and PC board conductor.

Figure 1C:
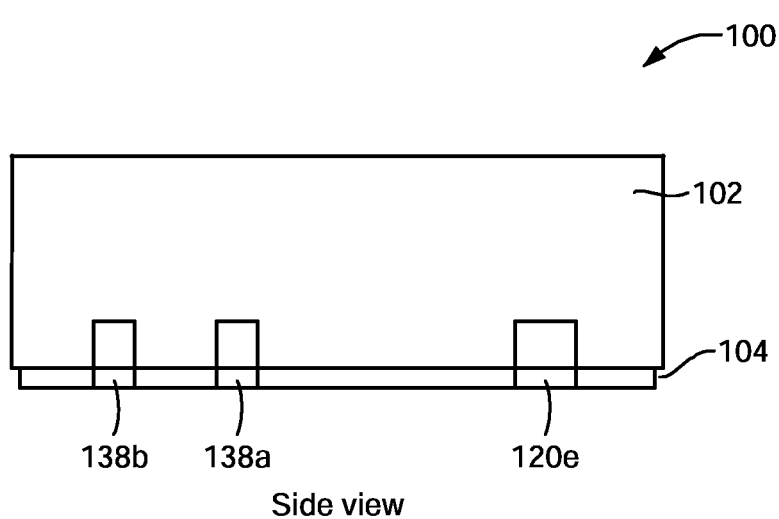
FIG. 1C shows a side view of the packaged current sensor integrated circuit of FIG. 1.

Referring also to FIG. 1C, in which like elements are labeled with like reference numbers, a side view of the packaged current sensor integrated circuit 100 is shown. Primary conductor input/output leads 138a, 138b and signal, or secondary lead 120e are exposed and approximately even with the plastic of the package body 102. The distance between the secondary lead 120e and primary lead 138a is selected to meet an electrical isolation requirement of the application. In an embodiment the spacing from the primary to the secondary leads is at least 1.0 mm on the surface, or outside, or the package to allow for a voltage isolation rating of 100V.

Recessed portion 104 of the package body 102 and leads 138a, 138b, 120e is shown around the bottom edge of the package. This recessed portion 104 can be used when the packaged current sensor integrated circuit 100 is assembled to a printed circuit board or other assembly to inspect or check for solder connections between the package 100 and the PC Board or assembly.

In an embodiment, the primary conductor 130 and secondary leads 120a-e can have a thickness on the order of 0.2 mm to 0.5 mm. In another embodiment the primary and secondary leads have a thickness of 0.375 mm, ranging in some cases from 0.35 to 0.40 mm, which is thicker than a standard integrated circuit package, where a standard thickness may be on the order of 0.2 mm-0.25 mm+/−0.025 mm for manufacturing tolerance. The thicker primary conductor serves to increase the cross-sectional area perpendicular to the current flow. The increased thickness of the current conductor material in the primary conductor 130 and current path portion 133 reduces power loss in a system which utilizes the current sensor package 100 of FIG. 1.

As noted above, the recessed portion 104 of the package body 102 can facilitate inspection of the packaged current sensor integrated circuit 100 once it is put into use (e.g., soldered to a circuit board). Because of the configuration of primary conductor leads 136a-136d, 138a-138d, such inspection can be made from three sides of the packaged circuit 100. The leads 136a, 136b and 136c, 136d of primary conductor 130 allow the inspection of the solder on adjacent sides of the package which are substantially orthogonal to each other as shown in FIG. 1 and FIG. 1B. Likewise, leads 138a, 138b and 138c, 138d allow inspection of the solder on adjacent sides of the package which are substantially orthogonal to each other. Leads 136c, 136d and 138c, 138d are on the same side of the package 100.

In another embodiment, the lead frame thickness may be a standard lead frame thickness. The primary current planned to be sensed by the current sensor package 100 or the absolute resistance required by an application can determine the thickness of the lead frame that is required.

Figure 2:
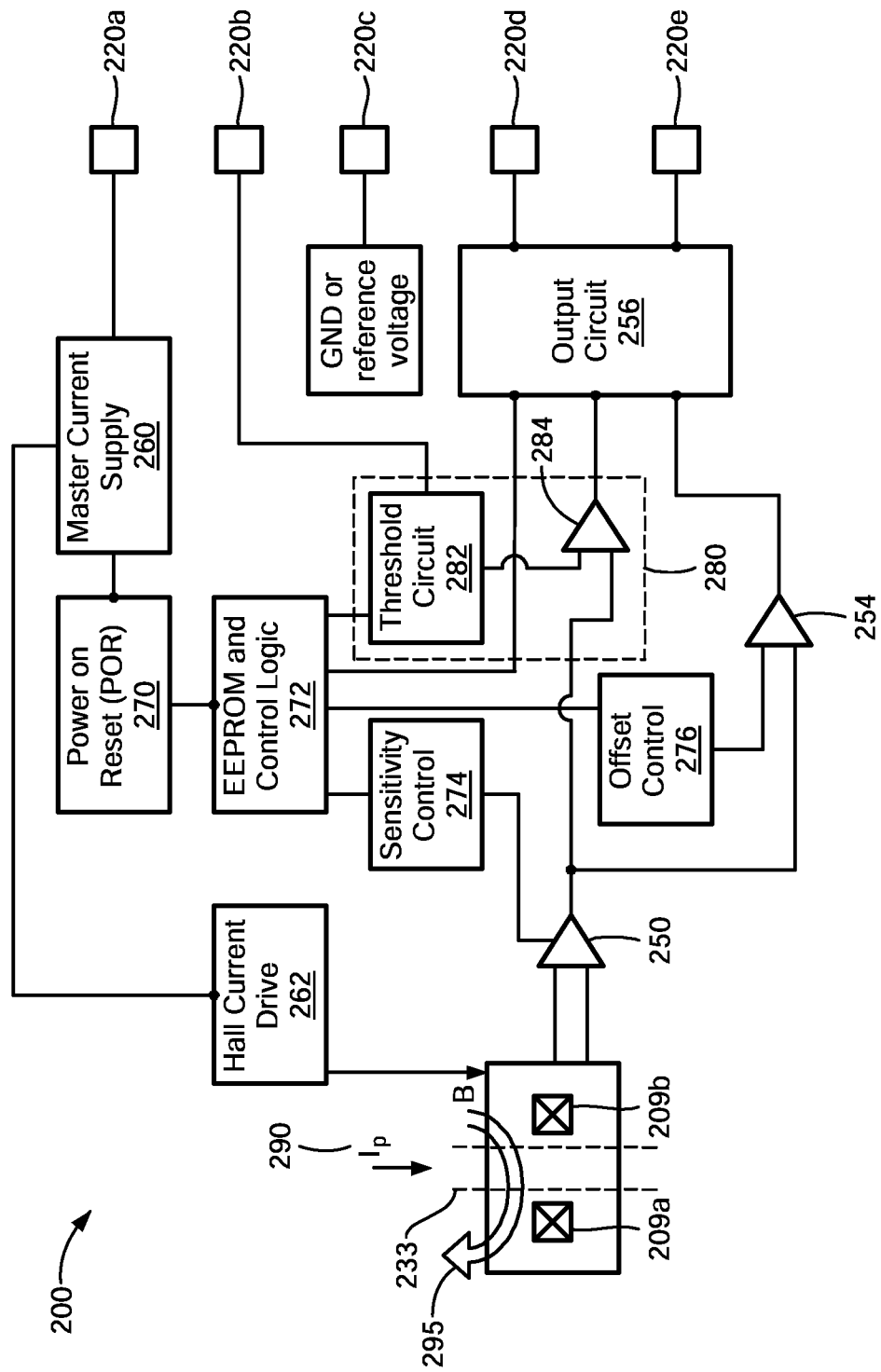
FIG. 2 provides an example circuit for a die in the packaged current sensor integrated circuit of FIG. 1.

Referring also to FIG. 2, a schematic of an example circuit block diagram for an integrated circuit 200 which may be on the die 108 in FIG. 1 is shown. The primary current $I_p$ 290 flows through a current conductor portion 233 (that may be the same as or similar to primary conductor 130 of FIG. 1) and generates a magnetic field B 295. The magnetic field B 295 contains a component which comes up into the die at magnetic field sensing element 209b and down into the magnetic field sensing element 209a for a current flowing from top to bottom in FIG. 2 (following the right-hand rule) when the current conductor portion 233 is below the die 200. The magnetic field sensing elements 209a, 209b may be planar Hall effect plates for example. The magnetic field 295 results in Hall effect plates 209a, 209b providing a signal to a front-end amplifier 250. The front-end amplifier 250 provides an output to amplifier 254, which may be a linear amplifier, which feeds into an output circuit 256. Output circuit 256 may be a digital or analog circuit that provides an output to at least one bond pad, or as shown in FIG. 2 two bond pads 220d, 220e. Output bond pad 220e may be a linear output that represents the magnetic field 295 measured and amplified through the amplifier 254. Other numbers of output bond pads more than two may also be provided. In an alternate embodiment, the amplifier 254 may provide an output directly to a bond pad 220e. Output bond pad 220d may be a fault output representative of a fault condition in the current sensor integrated circuit package.

Bond pad 220a provides a voltage and current input, typically Vcc, to provide power to the integrated circuit 200. A ground bond pad 220c may be provided to integrated circuit 200. In another embodiment, the voltage level provided at bond pad 220c may be other than ground, or a voltage above or below ground as a reference voltage to integrated circuit 200. Input bond pad 220a is coupled to a master current supply circuit 260 that provides power to the circuitry within integrated circuit 200. Although master current supply 260 is provided as a current supply, it would be apparent that voltages may also be provided to the circuits on integrated circuit 200. A Hall effect current drive circuit 262 takes current (or voltage) from the master current supply 260 and provides a regulated current to the Hall Effect sensing elements 209a, 209b. The master current supply 260 also provides power to a power on reset circuit 270. The power on reset circuit monitors the power coming into the circuit 200 and provides a signal to EEPROM and control logic circuit 272. The power on reset circuit 270 and EEPROM and control logic circuit 272 are used to configure and enable the integrated circuit, including the output circuit 256.

The EEPROM and control circuit 272 provides a signal to a sensitivity control circuit 274 which provides a signal to the front end amplifier 250 to adjust the sensitivity of the front end amplifier. The adjustment may be the result of a change in the power level in the circuit 200, or as a result of a temperature change of the circuit 200. The temperature sensor circuit is not shown in FIG. 2. An example of a temperature sensor circuit may include but is not limited to a diode temperature sensor, or the use of known temperature compensation resistors.

The EEPROM and control circuit 272 provides a signal to an offset control circuit 276. The offset control circuit 276 provides a signal to the amplifier 254. The offset control circuit 276 allows the circuit 200 to adjust the offset of the amplifier 254 for changes in power or temperature (the temperature compensation circuit is not shown) or a combination of temperature and power changes. The offset control circuit 276 may also provide adjustment for other offset sources, such as a stress in the integrated circuit die.

In another embodiment the EEPROM in the EEPROM and control circuit 272 may be replaced by another type of memory or used in combination with another type of non-volatile memory, including but not limited to a metal or polysilicon fuse, flash memory, or MRAM.

An input lead 220b may be provided to set a threshold for a fault indication circuit 280 (i.e., provide a fault trip level). In an embodiment the input lead 220b provides a fault voltage level. The fault indication circuit 280 consists of a threshold circuit 282 and a fault comparator 284. The EEPROM and control circuit 272 provides an input to the threshold circuit 282. The threshold circuit 282 provides a signal to the fault comparator 284, which compares the output of threshold circuit 282 with the output of the front end amplifier 250 to indicate when a fault exists to the output circuit block 256. The output circuit generates a fault output at output bond pad 220d. The fault output may indicate an overcurrent condition in which the current sensed in the current conductor path 233 exceeds a fault trip level, which trip level may be provided in the form of a fault voltage level on bond pad 220b. The fault allows, in one example, the user of the current sensor package 100 in FIG. 1 to turn off the current in the primary current path in order to prevent a high current condition in an electrical circuit connected to the primary conductor 130 of FIG. 1.

In an embodiment, functionality of the fault indication circuit 280 may be performed in a digital circuit or digital processor. The comparison to the fault trip level may include an analog to digital circuit (ADC) prior to a digital logic circuit, which may include a processor or microprocessor circuit, which compares the fault trip level voltage to a voltage provided by the front end amplifier and an ADC circuit to convert the analog voltage of the front end amplifier 250 to a digital voltage. In an embodiment, the amplifier 250 may be a buffer amplifier with a gain near or equal to unity (or one). In another embodiment, the amplifier 254 may be introduce a non-unity gain.

In an embodiment, a multiplexer circuit may be used to allow for the output of front end amplifier circuit 250 and the fault trip level voltage to use the same ADC. It will be apparent to those of ordinary skill in the art that other circuits, such as timing circuits and sample and hold circuits, may be used to implement a multiplexed digital circuit.

It is understood that any of the above-described processing may be implemented in hardware, firmware, software, or a combination thereof. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A packaged current sensor integrated circuit comprising:
   a primary conductor having an input portion and an output portion, wherein the primary conductor is configured to carry a current from the input portion of the primary conductor to the output portion of the primary conductor;
   at least one secondary lead;
   a semiconductor die disposed adjacent to the primary conductor;
   at least one magnetic field sensing element supported by the semiconductor die; and
   a package body enclosing the semiconductor die and at least a portion of the primary conductor, wherein the input portion of the primary conductor is exposed from a first side of the package body and a second side of the package body that is substantially orthogonal with respect to the first side of the package body, and wherein the output portion of the primary conductor is exposed from the second side of the package body and a third side of the package body that is substantially orthogonal with respect to the second side of the package body and opposite with respect to the first side of the package body.

2. The packaged current sensor integrated circuit of claim 1 wherein the primary conductor has a partial path that forms a straight line across the package body from the first side to the third side of the package.

3. The packaged current sensor integrated circuit of claim 1 wherein the primary conductor further comprises an exposed portion on the bottom of the package body.

4. The packaged current sensor integrated circuit of claim 1 wherein the secondary lead has an exposed portion on the bottom of the package body.

5. The packaged current sensor integrated circuit of claim 1 further comprising at least three secondary leads.

6. The packaged current sensor integrated circuit of claim 5 wherein at least one secondary lead provides an output connection, at least one secondary lead provides a voltage input connection, and at least one secondary lead provides a ground connection.

7. The packaged current sensor integrated circuit of claim 1 further comprising a front-end amplifier, wherein the at least one magnetic field sensing element is connected to the front-end amplifier.

8. The packaged current sensor integrated circuit of claim 1 wherein the at least one magnetic field sensing element is a Hall effect sensor.

9. The packaged current sensor integrated circuit of claim 8 further comprising a Hall effect current drive circuit connected to the Hall effect sensor.

10. The packaged current sensor integrated circuit of claim 1 wherein a front end amplifier is connected to an amplifier to provide an output of the current level in the primary conductor.

11. The packaged current sensor integrated circuit of claim 1 further wherein the at least one secondary lead provides an input fault signal.

12. The packaged current sensor integrated circuit of claim 11 further comprising a threshold circuit having an input configured to receive the input fault signal and an output and a comparator having a first input coupled to the output of the threshold circuit, a second input coupled to an output of the front end amplifier, and an output at which a fault signal is provided, wherein the fault signal is indicative of whether the current exceeds a level of the input fault signal.

13. The packaged current sensor integrated circuit of claim 1 further comprising a wafer backside coating material on a back side of the semiconductor die.

14. The packaged current sensor integrated circuit of claim 13 further comprising a second wafer backside coating material on the back of the semiconductor die.

15. The packaged current sensor integrated circuit of claim 1 wherein a thickness of the primary conductor and a thickness of the at least one secondary lead are between approximately 0.2 mm and 0.5 mm.

16. The packaged current sensor integrated circuit of claim 1 wherein a thickness of the primary conductor and a thickness of the at least one secondary lead are between approximately 0.35 mm and 0.40 mm.

17. The packaged current sensor integrated circuit of claim 3 wherein the primary conductor further comprises a narrowed portion between the input portion and the output portion and wherein the exposed portion of the primary conductor comprises the narrowed portion.

18. The packaged current sensor integrated circuit of claim 17 wherein the exposed narrowed portion of the primary conductor is substantially orthogonal to the first side of the package body, the second side of the package body, and the third side of the package body.

19. The packaged current sensor integrated circuit of claim 3 wherein the secondary lead has an exposed portion on the bottom of the package body and wherein a minimum distance between the exposed portion of the primary conductor and the exposed portion of a nearest at least one secondary lead is at least 1.0 mm.

20. A method of sensing a current in a current sensor integrated circuit package comprising:
    providing a primary conductor having an input portion and an output portion, wherein the primary conductor is configured to carry a current from the input portion of the primary conductor to the output portion of the primary conductor; wherein the input portion of the primary conductor is exposed from a first side of a package body of the current sensor integrated circuit package and a second side of the package body that is substantially orthogonal with respect to the first side of the package body, and wherein the output portion of the primary conductor is exposed from the second side of the package body and a third side of the package body that is substantially orthogonal with respect to the second side of the package body and opposite with respect to the first side of the package body;
    providing at least one secondary lead;
    providing a semiconductor die having at least one magnetic field sensing element disposed adjacent to the primary conductor;
    measuring a magnetic field representative of the current in the primary conductor with the at least one magnetic field sensing element; and
    providing an output signal representative of the current in the primary conductor.

21. The method of claim 20 further comprising:
    providing a fault input voltage at a fault signal pin;
    comparing the fault input voltage with an output of a front-end amplifier representative of the current in the primary current conductor; and
    providing a fault output.

* * * * *

UNITED STATES PATENT AND TRADEMARK OFFICE
CERTIFICATE OF CORRECTION

PATENT NO. : 11,519,946 B1
APPLICATION NO. : 17/409011
DATED : December 6, 2022
INVENTOR(S) : Simon E. Rock et al.

It is certified that error appears in the above-identified patent and that said Letters Patent is hereby corrected as shown below:

In the Specification

Column 1, Line 41 delete "exposed portion on" and replace with --exposed on--.

Column 5, Line 54 delete ", or the" and replace with --, for the--.

Column 5, Line 57 delete "is shown" and replace with --are shown--.

Column 7, Line 65 delete "may be" and replace with --may--.

In the Claims

Column 9, Line 21 delete "further wherein" and replace with --wherein--.

Signed and Sealed this
Twenty-first Day of November, 2023

Katherine Kelly Vidal
*Director of the United States Patent and Trademark Office*